US009019757B2

(12) United States Patent
Nakamura et al.

(10) Patent No.: US 9,019,757 B2
(45) Date of Patent: Apr. 28, 2015

(54) SPIN WAVE ELEMENT

(75) Inventors: Shiho Nakamura, Kanagawa-ken (JP);
Daisuke Saida, Tokyo (JP); Hirofumi Morise, Kanagawa-ken (JP); Tsuyoshi Kondo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1230 days.

(21) Appl. No.: 12/880,606

(22) Filed: Sep. 13, 2010

(65) Prior Publication Data

US 2011/0234216 A1    Sep. 29, 2011

(30) Foreign Application Priority Data

Mar. 23, 2010  (JP) ................................ P2010-066832

(51) Int. Cl.
*G11C 11/16* (2006.01)
*G11C 11/14* (2006.01)
*G01R 33/12* (2006.01)
*H01L 27/22* (2006.01)
*H01L 29/66* (2006.01)

(52) U.S. Cl.
CPC .......... *G01R 33/1284* (2013.01); *H01L 27/226* (2013.01); *H01L 29/66984* (2013.01); *H01L 27/222* (2013.01); *G11C 11/14* (2013.01); *G11C 11/161* (2013.01)

(58) Field of Classification Search
CPC ................. G11C 11/14; G11C 11/161; H01L 29/66984; H01L 27/222; H01L 27/226

USPC ................................................... 365/158.171
See application file for complete search history.

(56) References Cited

U.S. PATENT DOCUMENTS

| 7,501,688 | B2 * | 3/2009 | Saito ............................. 257/421 |
| 7,528,456 | B1 | 5/2009 | Khitun et al. |
| 7,678,475 | B2 | 3/2010 | Slavin et al. |
| 8,085,582 | B2 * | 12/2011 | Nakamura et al. ............ 365/158 |
| 8,476,724 | B2 * | 7/2013 | Kondo et al. ................. 257/421 |
| 8,569,852 | B2 * | 10/2013 | Morise et al. ................. 257/421 |
| 2009/0096044 | A1 | 4/2009 | Eshaghian-Wilner et al. |
| 2010/0225312 | A1 | 9/2010 | Nakamura et al. |

* cited by examiner

*Primary Examiner* — Evan Pert
(74) *Attorney, Agent, or Firm* — Oblon, McClelland, Maier & Neustadt, L.L.P.

(57) ABSTRACT

A spin wave element includes a substrate, a multilayer, a detecting portion, and two or more input portions. The multilayer having a lamination direction thereof is formed on the substrate and includes a first ferromagnetic layer. The first ferromagnetic layer has magnetization whose direction is in the lamination direction. The detecting portion and the input portions are formed on the multilayer and separated from each other by a first nonmagnetic layer. In addition, a portion of an outer edge of the multilayer viewed from the lamination direction makes a portion of one ellipsoid. The detecting portion and one of the input portions are located on the long axis of the one ellipsoid. The portion of the one ellipsoid is located on a side of one of the input portions.

10 Claims, 16 Drawing Sheets

10 --- SPIN WAVE ELEMENT
20 --- SUBSTRATE
25 --- ELECTRODE LAYER
30 --- MULTILAYER
40 --- INPUT PORTION
50 --- DETECTING PORTION
60 --- NONMAGNETIC INSULATING LAYER
70 --- NONMAGNETIC LAYER
80, 90 --- ELECTRODES

| 10 | ... SPIN WAVE ELEMENT | 60 | ... NONMAGNETIC INSULATING LAYER |
| --- | --- | --- | --- |
| 20 | ... SUBSTRATE | 70 | ... NONMAGNETIC LAYER |
| 25 | ... ELECTRODE LAYER | 80, 90 | ... ELECTRODES |
| 30 | ... MULTILAYER | | |
| 40 | ... INPUT PORTION | | |
| 50 | ... DETECTING PORTION | | |

31, 33 ⋯ NONMAGNETIC LAYERS
32 ⋯ FERROMAGNETIC LAYER WITH PERPENDICULAR MAGNETIZATION

41 ⋯ INPUT PORTION

SPIN WAVE ELEMENT

CROSS REFERENCE TO RELATED APPLICATION

This application is based upon and claims the benefit of priority from the prior Japanese Patent Application No. 2010-066832, filed on Mar. 23, 2010, the entire contents of which are incorporated herein by reference.

FIELD

Embodiments relate generally to a spin wave element.

BACKGROUND

A spin wave element is disclosed in a published US patent application 2007/0296516, and is provided with a ferromagnetic layer formed on a substrate, two or more input portions and a detecting portion. This spin wave element generates spin waves in the ferromagnetic layer with the same phase or different phase by passing a current into the input portions, and detects the propagating spin wave at the detecting portion.

In the spin wave element disclosed in the published US patent application, the spin wave propagates as a plane wave inside the ferromagnetic layer. However, if the spin wave propagates as a spherical wave, the spin wave will spread spherically to make it difficult to detect the spin wave at the detecting portion.

BRIEF DESCRIPTION OF THE DRAWINGS

Aspects of this disclosure will become apparent upon reading the following detailed description and upon reference to accompanying drawings. The description and the associated drawings are provided to illustrate embodiments of the invention and not limited to the scope of the invention.

DESCRIPTION

Figure 1:
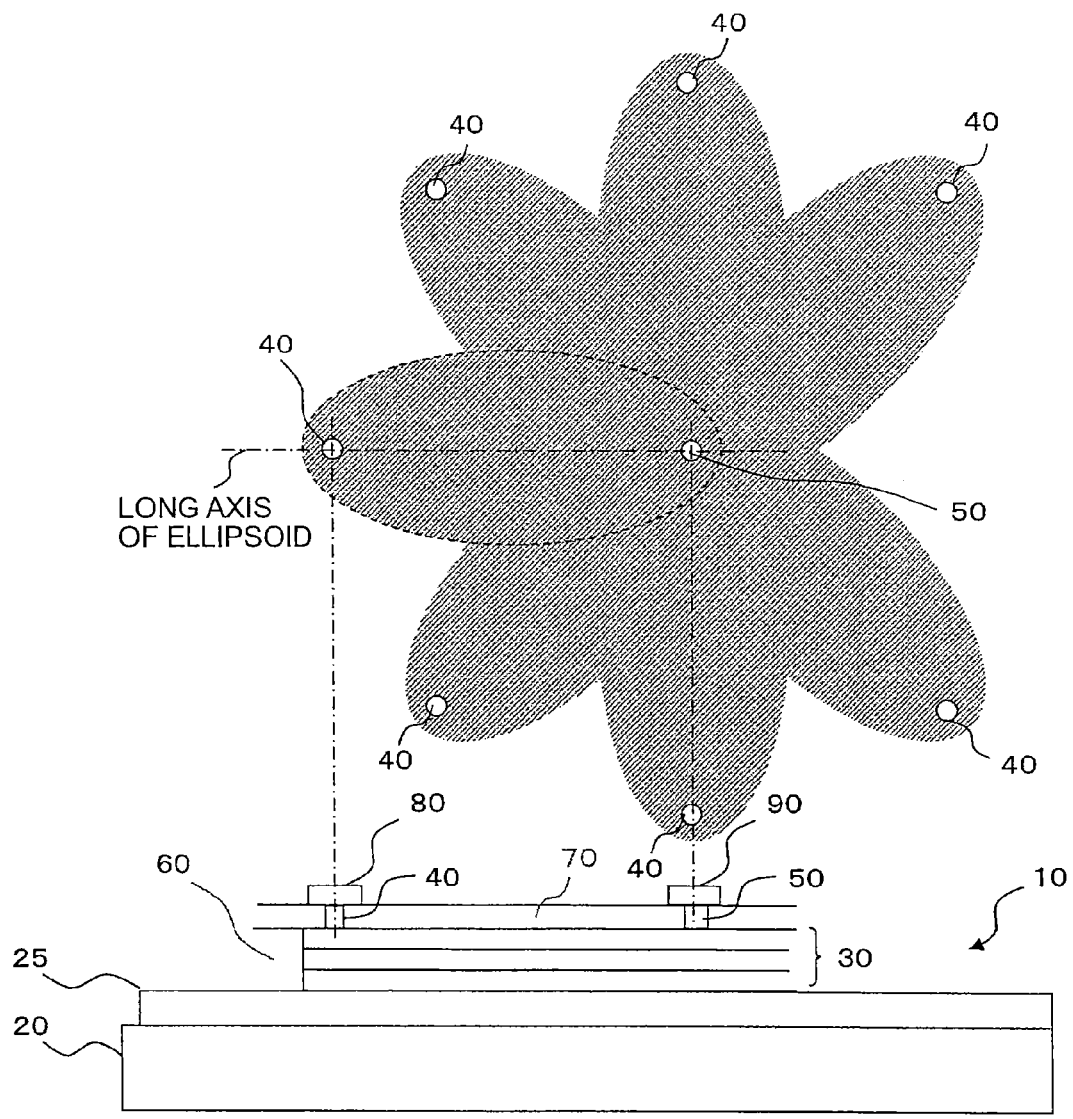
FIG. 1 is a view showing a structure of a spin wave element in accordance with a first embodiment.

Embodiments will be explained in detail with reference to drawings below. Wherever possible, the same reference numerals or marks will be used to denote the same or like portions throughout figures, and overlapped explanations are omitted in the embodiments.

First Embodiment

FIG. 1 is a view showing a structure of a spin wave element 10 in accordance with a first embodiment.

The upper drawing of FIG. 1 is a view showing a multilayer 30 viewed from a lamination direction of the multilayer 30. The lower drawing of FIG. 1 is a sectional view of the spin wave element 10.

As shown in the lower drawing of FIG. 1, the spin wave element 10 in accordance with this embodiment is provided with an electrode layer 25 formed on a substrate 20. The multilayer 30 is formed on the electrode layer 25. A detecting portion 50 and two or more input portions 40 are formed on the multilayer 30. The input portions 40 and the detecting portion 50 are separated from each other via the nonmagnetic layer 70. Electrodes 80 and an electrode 90 are formed on the input portions 40 and the detecting portion 50, respectively. A nonmagnetic insulating layer 60 is formed on the electrode layer 25 so that the nonmagnetic insulating layer 60 encompasses the multilayer 30. That is, the nonmagnetic insulating layer 60 covers a sidewall of the multilayer 30 in the in-plane direction of the multilayer 30. The multilayer 30 includes a ferromagnetic layer whose magnetization direction is perpendicular to the plane thereof (i.e., parallel to the lamination direction thereof).

As shown in the upper drawing of FIG. 1, the spin wave element 10 is provided with two or more input portions 40 for one detecting portion 50.

As shown in the upper drawing of FIG. 1, when the multilayer 30 is viewed from the lamination direction thereof, a portion of the outer edge of the multilayer 30 makes an ellipsoid whose long axis connects the detecting portion 50 and one input portion 40 to each other. In addition, an ellipsoid is provided to each input portion 40 so that the outer edge of the multilayer 30 on the opposite side of the detecting portion 50 makes a portion of the ellipsoid. Alternatively, another input portion 40 may be formed between the input portion 40 and the detecting portion 50. The sidewall of the multilayer 30 is covered with the nonmagnetic insulating layer 60 along the outer edge of the multilayer 30 on the substrate. The ferromagnetic layer included in the multilayer 30 has magnetization whose direction is parallel to the lamination direction, and is in contact with the nonmagnetic insulating layer 60 along the ellipsoidal outer edge. The multilayer 30 is formed as the shape mentioned above, thereby allowing it to effectively detect a spin wave, which is generated from the input portion 40, at the detecting portion 50.

Figure 2:
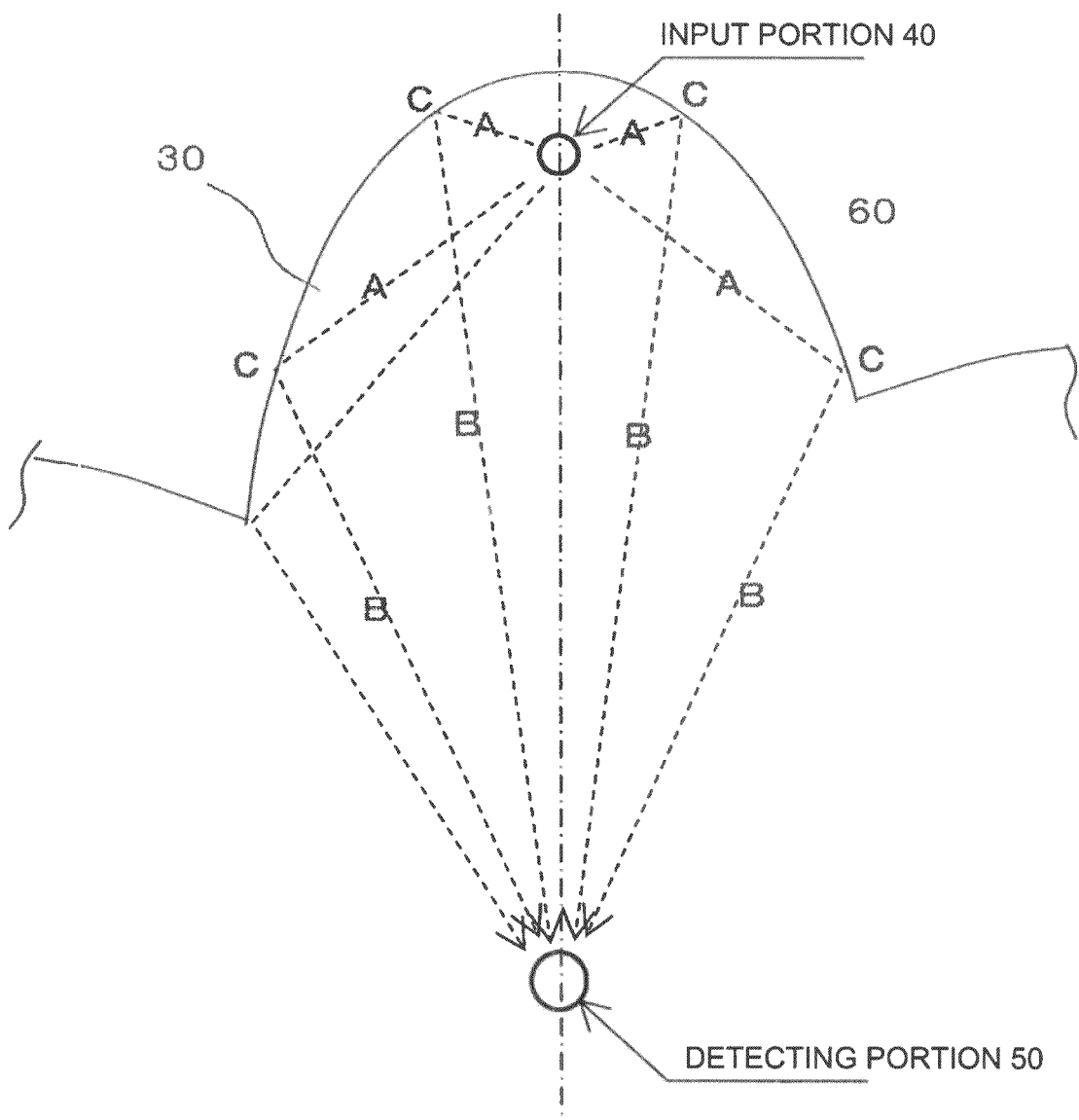
FIG. 2 is a view to explain how a spin wave generated at an input portion is reflected at the ellipsoidal outer edge of a multilayer included in the spin wave element.

FIG. 2 is a view to explain how a spin wave generated at the input portion 40 is reflected at the ellipsoidal outer edge of the multilayer 30. The dotted lines denote paths of the spin wave, thereby showing that the spin wave propagates as a spherical wave (spherical spin wave) from the input portion 40 through a spin wave medium, i.e., a perpendicular magnetization layer. The arrows of dotted lines show the directions of movement of the spherical wave reflected.

As shown in FIG. 2, the spin wave propagating from the input portion 40 in various directions are reflected at the ellipsoidal boundary between the multilayer 30 and the nonmagnetic insulating layer 60. This is because the nonmagnetic insulating layer 60 cannot pass a spin wave therethrough. Accordingly, the spin wave reflected at the boundary propagates toward the detecting portion 50. The ellipsoidal boundary allows it to efficiently focus the reflected spin wave on the detecting portion 50 located on the long axis of the ellipsoid owing to the ellipsoidal shape thereof. When the planer shape of the multilayer 30 is a rectangle or any other than an ellipsoid, the spin wave is reflected at the boundary between the multilayer 30 and the nonmagnetic insulating layer 60, but the reflected spin wave is not focused on one point, i.e., the detecting portion 50. The spin wave element 10 in accordance with this embodiment is employed to allow it to completely focus the spin wave. The spin wave element 10 needs no additional component to focus spin waves. Focusing a spherical spin wave allows it to not only avoid a disadvantage of a spherical wave attenuating more rapidly than a plane wave but also conversely obtain larger amplitude from the spherical wave than from the plane wave. "A" is assumed to be a distance between the input portion 40 and a reflection point of the spin wave at the ellipsoidal boundary between the multilayer 30 and the nonmagnetic insulating layer 60. "B" is assumed to be a distance between the reflection point and the detecting portion 50. In case that A is shorter than B, a line (curve) to be formed by a group of the reflection points C is defined as "input 40 side". The reflection points are located at the ellipsoidal boundary between the multilayer 30 and the nonmagnetic insulating layer 60.

In FIG. 1, the ellipsoids formed for the respective input portions 40 have the same size. Alternatively, the sizes of the respective ellipsoids may be designed in accordance with use purposes. For example, when the spin wave element is employed for a finite impulse response, the respective ellipsoids are formed to have different sizes. This allows it to vary the propagation time of a spin wave in accordance with the size of the ellipsoid. The size of the ellipsoid is determined in accordance with the material properties of the ferromagnetic layer included in the multilayer 30 and a delay time to be required.

Figure 3:
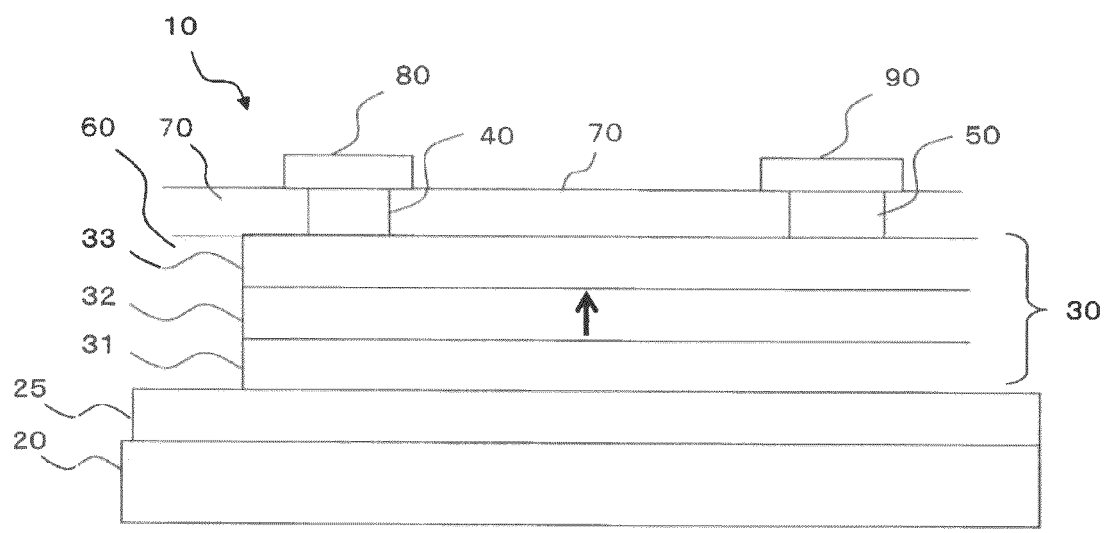
FIG. 3 is a view showing a structure of a multilayer of the spin wave element in accordance with the first embodiment.

FIG. 3 is a view showing a structure of the multilayer 30 of the spin wave element 10 in accordance with this embodiment. The multilayer 30 has a nonmagnetic layer 31, a ferromagnetic layer 32, and a nonmagnetic layer 33 which are formed in this order.

Si can be employed for a substrate 20, for example. Alternatively, CMOS (Complementary Metal Oxide Semiconductor) may be employed for the substrate 20.

Copper (Cu), gold (Au), silver (Ag), and aluminum (Al) can be employed for an electrode layer 25, for example. Alternatively, an alloy containing at least two kinds of these elements may be employed for the electrode layer 25. Moreover, at least one element may be selected from these elements to be alloyed with the rest.

Ta, Ru, Pt, Pd, Ir, Cu, Au, Ag, Cr, and Al can be employed for the nonmagnetic layers 31, 33, for example. Alternatively, an alloy containing at least two kinds of these elements may be employed for the nonmagnetic layers 31, 33. Moreover, at least one element may be selected from these elements to be alloyed with the rest. Alternatively, these elements may be laminated to be a laminated structure. Moreover, nonmagnetic insulators, such as MgO, $Al_2O_3$, or $SiO_2$, can also be employed.

The ferromagnetic layer 32 has magnetization whose direction is perpendicular to the layer plane (i.e., parallel to the lamination direction). That is, the ferromagnetic layer 32 is a perpendicular magnetization layer. FeVPd, FeCrPd, CoFePt, etc. can be employed for the ferromagnetic layer 32, for example. At least one element selected from the group consisting of iron (Fe), cobalt (Co), nickel (Ni), manganese (Mn), and chromium (Cr), and at least one element selected from the group consisting of platinum (Pt), palladium (Pd), iridium (Ir), ruthenium (Ru), and rhodium (Rh) can be combined to produce these alloys. The properties of these alloys, i.e., FeVPd, FeCrPd, CoFePt, etc., can be controlled by alloy compositions or heat treatments thereof. Moreover, amorphous alloys containing rare earth-transition metals, such as TbFeCo, GdFeCo etc., or laminated structures, such as Co/Pt, Co/Pd, Co/Ni etc., are also preferably employed. Furthermore, it is possible to control crystal orientations of Co/Ru, Fe/Au, Ni/Cu etc. to be employed. Co/Ru, Fe/Au, Ni/Cu etc. are combined with the nonmagnetic layers 31 and 33 to be perpendicular magnetization films. Ferrite series oxides, such as yttrium iron garnet, manganese ferrite or γ-iron oxide etc. can be further employed to reduce a loss of a spin wave. Furthermore, using a magnetic semiconductor can enhance functionality of the spin wave element.

Copper (Cu), gold (Au), silver (Ag), aluminum (Al), platinum (Pt), palladium (Pd), ruthenium (Ru), iridium (Ir), and tungsten (W) can be employed for the input portions 40 and the detecting portion 50, for example. Alternatively, these elements may be combined. Alternatively, an alloy containing at least two kinds of these elements may be employed. Moreover, at least one element may be selected from these elements to be alloyed with the rest. Moreover, a carbon nanotube or a carbon nanowire can be also employed.

The shape of the input portion 40 is a dot, e.g., a circle, an ellipsoid, a polygon. The dot shape can generate a spherical spin wave at the input portion 40. The contact surface between the input portions 40 and the multilayer 30 preferably has a maximum diameter of 500 nm or less to control magnetic domains, and more preferably has a maximum diameter of 100 nm or less for excitation efficiencies and integration of spin wave elements. In addition, the minimum diameter of the contact surface is preferably 1 nm. If the minimum diameter is smaller than 1 nm, the energy for exciting a spin wave becomes large, thereby being undesirable. Here, when the dot shape is an ellipsoid or a quadrangle (polygon), the "diameter" means the length of the long axis of the ellipsoid or the diagonal of the quadrangle (polygon).

The shape of the detecting portion 50 can be a dot or the like, e.g., circular, ellipsoidal, quadrangular, and polygonal. The size (average diameter) of the detecting portion 50 is preferably different from the wavelength of a spin wave propagating through the ferromagnetic layer 32. If the size of the detecting portion 50 is equal to the wavelength of the spin wave, there is a possibility that the spin wave is canceled out on the side of the detecting portion 50. When the shape of the input portion 40 or the detecting portion 50 is not symmetric, it is difficult to define a line connecting the two portions. In this case, the line may be determined by connecting the gravity points of the respective portions.

$SiO_2$, $Al_2O_3$, MgO etc. can be employed for the nonmagnetic insulating layer 60, for example.

The same materials as those for the nonmagnetic insulating layer 60 can be employed for the nonmagnetic insulating layer 70. When the same materials as those for the nonmagnetic insulating layer 60 are employed, it becomes preferably easy to manufacture the spin wave element. Moreover, when using near-field light for input or output as will be mentioned later, Au (gold), Pt (platinum), Ir (iridium), Cu (copper), or an alloy containing at least two kinds of these elements, for example, can be employed. Alternatively, at least one element may be selected from these elements to be alloyed with the rest, and the alloyed material can be employed for a nonmagnetic metal.

A conductive magnetic material or a nonmagnetic material is employed for the electrodes 80 and 90.

For the ferromagnetic layer, an in-plane magnetization film or a perpendicular magnetization film can be employed. The in-plane magnetization film has its magnetization substantially parallel to a principal surface thereof. The principal surface is parallel to the substrate 20. The perpendicular magnetization film has its magnetization substantially perpendicular to the principal surface thereof. A magnetic metal containing at least one element selected from the group consisting of iron (Fe), cobalt (Co), and nickel (Ni), for example, can be employed for the in-plane magnetization film. The same materials as those of the ferromagnetic layer 32 can be employed for the perpendicular magnetization film.

The nonmagnetic materials include copper (Cu), gold (Au), silver (Ag), or aluminum (Al). Alternatively, these elements may be alloyed. The nonmagnetic materials also include carbon nanotube, carbon nanowire, graphene etc.

An operating principle of the spin wave element 10 in accordance with this embodiment will be explained below.

A current is passed from the electrode 80 to the electrode layer 25 via the input portion 40. Then, the magnetization in the ferromagnetic layer 32 is excited to start a precession motion. The precession motion of the magnetization is transmitted one after another inside the ferromagnetic layer 32, thereby generating a spin wave. The spin wave spreads through the ferromagnetic layer 32 as a spherical wave due to the dot shape of the input portion 40. And, the spin wave generated at the input portion 40 propagates through the ferromagnetic layer 32 to reach the detecting portion 50. Then, an induced electromotive force, or a combination of a spin pumping effect and an inverse spin Hall effect generates electric potential at the detecting portion 50. Detecting the electric potential allows it to detect the spin wave. The spin pumping effect and the inverse spin Hall effect are phenomena where a spin wave is absorbed as spin-polarized electrons, and the spin-polarized electrons are then scattered to cause a change in the electric potential.

As a method for generating a spin wave, a voltage may be applied between the electrode 80 and the electrode layer 25 to excite the magnetization of the ferromagnetic layer 32. Alternatively, holes may be made in the electrode 80 and the input portion 40 to introduce light into the holes. As the light, near-field light is employed to excite the magnetization of the ferromagnetic layer 32. In this case, the electrode 80 and the input portion 40 themselves may be holes. The holes may be unfilled, or filled with a dielectric. However, when employing near-field light, the electrode layer 25 is not needed owing to optical excitation.

Next, an example of the manufacturing method of the spin wave element 10 in accordance with the first embodiment will be explained below.

Forming the electrode layer 25 on the substrate 20 is followed by arranging the substrate having the electrode layer 25 in an ultrahigh-vacuum sputtering apparatus.

Then, the nonmagnetic layer 31, the ferromagnetic layer 32, and the nonmagnetic layer 33 are formed on the electrode layer 25 in this order. Forming these layers completes the multilayer 30.

Next, resist is applied on the nonmagnetic layer 33, and is exposed to light to be developed using a stepper photolithography machine. Then, the resist is patterned to have an ellipsoidal shape. Furthermore, the circumferences of the nonmagnetic layer 31, the ferromagnetic layer 32, and the nonmagnetic layer 33 are removed by ion milling to form the multilayer 30 having an ellipsoidal shape.

Next, the multilayer 30 is masked using a mask to form the nonmagnetic insulating layer 60 on both the substrate 20 and the mask. Then, the mask formed on the multilayer 30 is removed to form the nonmagnetic layer 70 on the nonmagnetic insulating layer 60 and the multilayer 30.

Next, electron beam resist is applied on the nonmagnetic layer 70 and exposed to an electron beam, thereby defining first apertural areas on the electron beam resist to provide the input portions 40 and the detecting portion 50. The nonmagnetic layer 70 is removed using the exposed pattern defining the first apertural areas formed on the electron beam resist, thereby finally forming the first apertural areas for the input portions 40 and the detecting portion 50. A metal is deposited to be buried in the first apertural area provided on the nonmagnetic layer 70, and the electron beam resist is finally removed, thereby forming the input portions 40 and the detecting portion 50 which are made from the metal.

Next, resist is applied on the nonmagnetic layer 70, the input portion 40, and the detecting portion 50. The resist is exposed to KrF ultraviolet for patterning by using a KrF stepper, thereby forming second apertural areas on the resist to connect the electrodes 80, 90 to the input portions 40 and the detecting portion 50. Finally, a metal is deposited to be buried in the second apertural areas, and then the resist is removed to form the electrodes 80 and 90, thereby completing the spin wave element 10.

In addition, interconnections are provided to the electrodes 80, 90 to perform electric input/output.

The spin wave element 10 in accordance with the present embodiment provides a spin wave element with excellent transmission efficiency.

Second Embodiment

Figure 4:
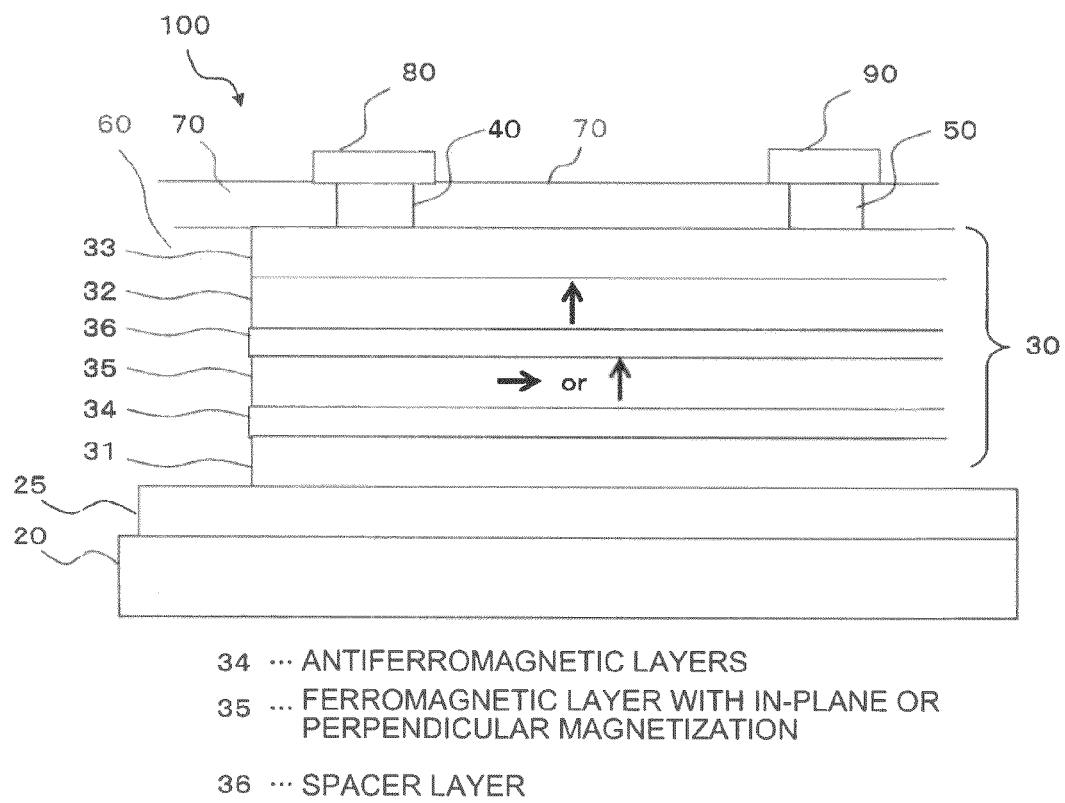
FIG. 4 is a view showing a spin wave element in accordance with a second embodiment.

FIG. 4 is a view showing a spin wave element 100 in accordance with a second embodiment.

The spin wave element 100 in accordance with the second embodiment differs from the spin wave element 10 in accordance with the first embodiment in that an antiferromagnetic layer 34, a ferromagnetic layer 35 and a spacer layer 36 are provided between the nonmagnetic layer 31 and the ferromagnetic layer 32.

The antiferromagnetic layer 34 is employed to fix the magnetization direction of the ferromagnetic layer 35. IrMn can be employed for the antiferromagnetic layer 34, for example.

The magnetization direction of the multilayer 30 is in a direction parallel or perpendicular to the lamination direction thereof. The same material as that for the ferromagnetic layer 32 can be employed for the ferromagnetic layer 35.

A tunnel insulator film or a nonmagnetic metal film can be employed for the spacer layer 36.

The tunnel insulator materials include oxides, nitrides, fluoride, and oxide-nitride composites containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe), for example. In addition, semiconductors having a wide energy gap, such as AlAs, GaN, AlN, ZnSe, ZnO and MgO, are also included therein. Such materials are employed to allow it to output a large reproduction signal on reading at the detecting portion 50. The thickness of the spacer layer 36 is set to a value of 0.2 nm to 2.0 nm, thereby leading to a larger reproduction signal.

The nonmagnetic metals include copper (Cu), gold (Au), silver (Ag), and aluminum (Al), for example. Alternatively, these elements may be alloyed. In this case, the thickness of the spacer layer 36 is preferably not less than 1.5 nm and not more than 20 nm. Such a thickness allows it to control the layer coupling between the ferromagnetic layers 32 and 35. Furthermore, the spin polarization state of conduction electrons passing through the spacer layer 36 is maintained.

Next, the operating principle of the spin wave element 100 in accordance with this embodiment will be explained below.

The spin wave element 100 in accordance with this embodiment is provided with the action of the spin wave element 10 described in the first embodiment, and is capable of detecting a magnetoresistive effect (MR: MagnetoResistance) to detect a spin wave. This is because the magnetoresistance changes in accordance with a change in the magnetization direction due to a spin wave propagating through the ferromagnetic layer 32 just below which the magnetization of the ferromagnetic layer 35 is fixed.

When manufacturing the spin wave element 100 in accordance with this embodiment, the spin wave element 100 differs from the spin wave element 10 in accordance with the first embodiment only in the structure of the multilayer 30. The manufacturing method of the spin wave element 100 can be explained using the manufacturing method of the spin wave element 10. Therefore, explanations are omitted.

In the spin wave element 100 in accordance with this embodiment, the layers from the nonmagnetic layer 31 to the nonmagnetic layer 33 included in the multilayer 30 may be formed in the vertically reverse order. Even when the multilayer 30 is formed in the vertically reverse order, the outer edge of the ferromagnetic layer 32 viewed from the lamination direction of the multilayer 30 partially makes an ellipsoid, and the input portion 40 and the detecting portion 50 are on a long axis of the ellipsoid, thereby producing the effect of the invention.

Third Embodiment

Figure 5:
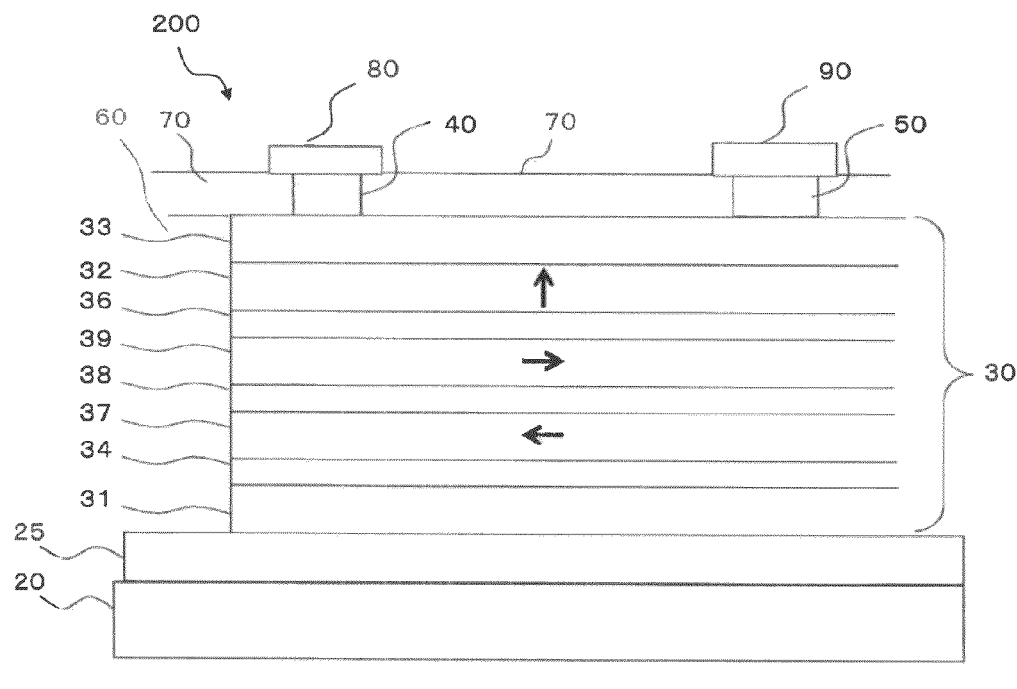
FIG. 5 is a view showing a spin wave element in accordance with a third embodiment.

FIG. 5 is a view showing a spin wave element 200 in accordance with a third embodiment.

The spin wave element 200 in accordance with this embodiment differs from the spin wave element 100 in accordance with the second embodiment in that the ferromagnetic layer 37, the intermediate layer 38, and the ferromagnetic layer 39 are provided between the spacer layer 36 and the antiferromagnetic layer 34.

The ferromagnetic layer 37 and the ferromagnetic layer 39 are antiferromagnetically coupled with each other through the intermediate layer 38. This antiferromagnetic coupling therebetween can strongly fix the magnetization direction of the ferromagnetic layer 39.

The magnetization directions of the ferromagnetic layers 37, 39 are perpendicular to the lamination direction of the multilayer 30, i.e., in the in-plane direction thereof. Moreover, the ferromagnetic layers 37, 39 include magnetic metals containing at least one element selected from the group consisting of iron (Fe), cobalt (Co), nickel (Ni), manganese (Mn), and chromium (Cr).

Ru can be employed for the intermediate layer 38, for example.

When manufacturing the spin wave element 200 in accordance with this embodiment, the spin wave element 200 differs from the spin wave element 10 in accordance with the first embodiment only in the structure of the multilayer 30. The manufacturing method of the spin wave element 200 can be explained using the manufacturing method of the spin wave element 10. Therefore, explanations are omitted.

In this embodiment, the layers between the nonmagnetic layer 31 and the nonmagnetic layer 33 both included in the multilayer 30 may be formed in the vertically reverse order. Even when the multilayer 30 is formed in the vertically reverse order, the outer edge of the ferromagnetic layer 32 partially makes an ellipsoid and the input portion 40 and the detecting portion 50 are on a long axis of the ellipsoid, thereby producing the effect of the invention.

First Modified Example

Figure 6:
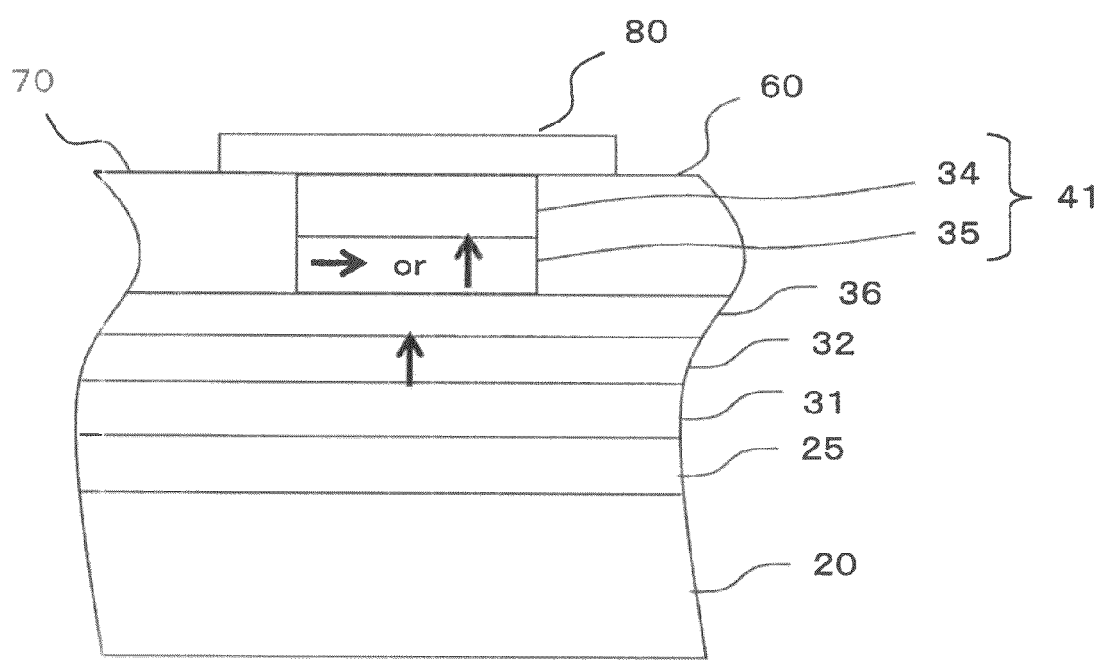
FIG. 6 is a view showing a modified example of the input portion of the spin wave element in accordance with the first embodiment.

FIG. 6 is a view showing a modified example of the input portion 40 of the spin wave element 10 in accordance with the first embodiment.

An input portion 41 of the first modified example differs from the input portion 40 of the spin wave element 10 in accordance with the first embodiment in the following points. The input portion 41 is provided with the ferromagnetic layer 35 and the antiferromagnetic layer 34. In addition, the nonmagnetic layer is substituted by the spacer layer 36.

However, in this case, even if holes are made in the electrode 80 and the input portion 41 to introduce light into the holes, near-field light cannot be generated.

Second Modified Example

Figure 7:
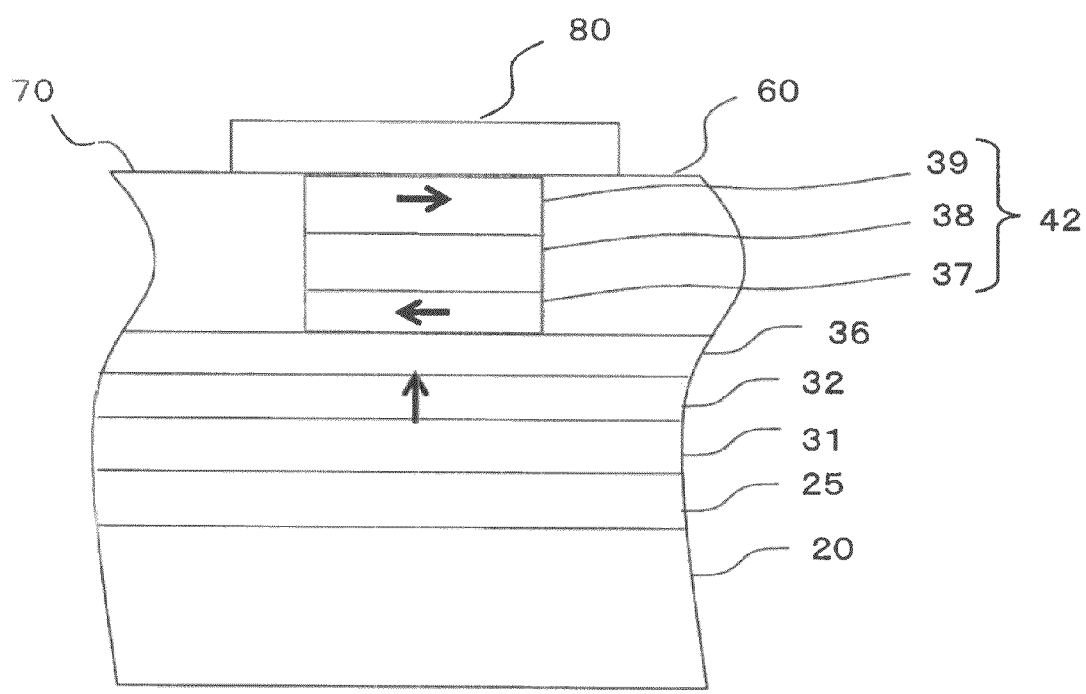
FIG. 7 is a view showing a second modified example of the input portion of the spin wave element in accordance with the first embodiment.

FIG. 7 is a view showing a second modified example of the input portion 40 of the spin wave element 10 in accordance with the first embodiment.

An input portion 42 in accordance with the second modified example differs from the input portion 40 of the spin wave element 10 in accordance with the first embodiment in the following points. The input portion 42 in accordance with the second modified example is provided with the ferromagnetic layer 37, the intermediate layer 38, and the ferromagnetic layer 39. In addition, the nonmagnetic layer 33 is replaced by the spacer layer 36.

However, even if holes are made in the electrode 80 and the input portion 42 to introduce light into the holes, near-field light cannot be generated.

Third Modified Example

Figure 8:
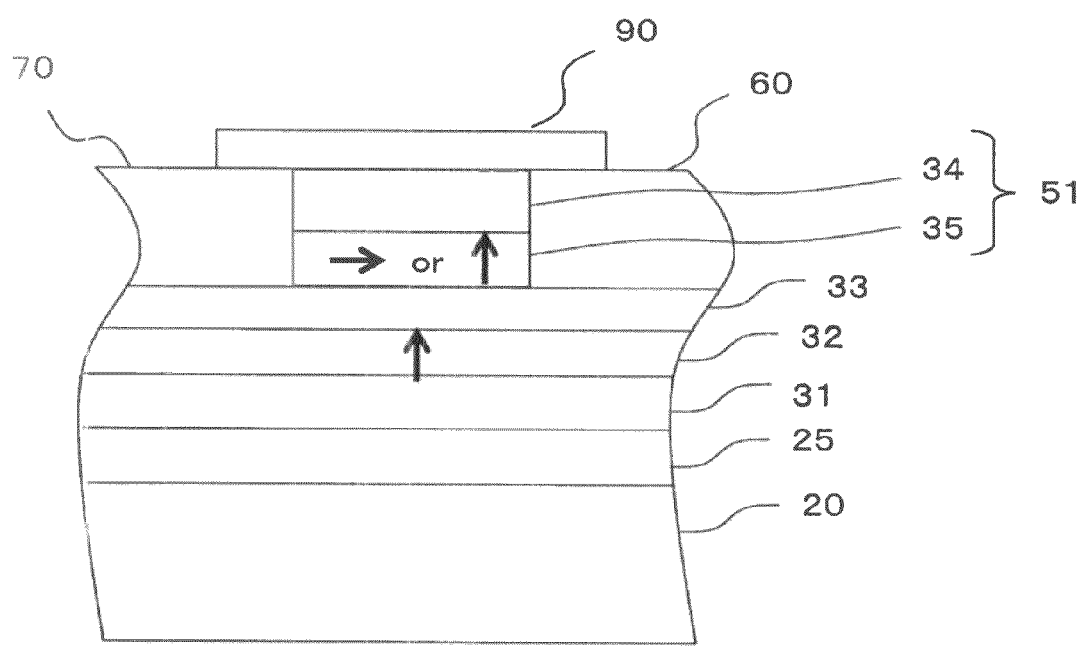
FIG. 8 is a view showing a third modified example of the detecting portion of the spin wave element in accordance with the first embodiment.

FIG. 8 is a view showing a third modified example of the detecting portion 50 of the spin wave element 10 in accordance with the first embodiment.

A detecting portion 51 in accordance with the third modified example differs from the detecting portion 50 of the spin wave element 10 in accordance with the first embodiment in that the detecting portion 51 is provided with the ferromagnetic layer 35 and the antiferromagnetic layer 34.

Fourth Modified Example

Figure 9:
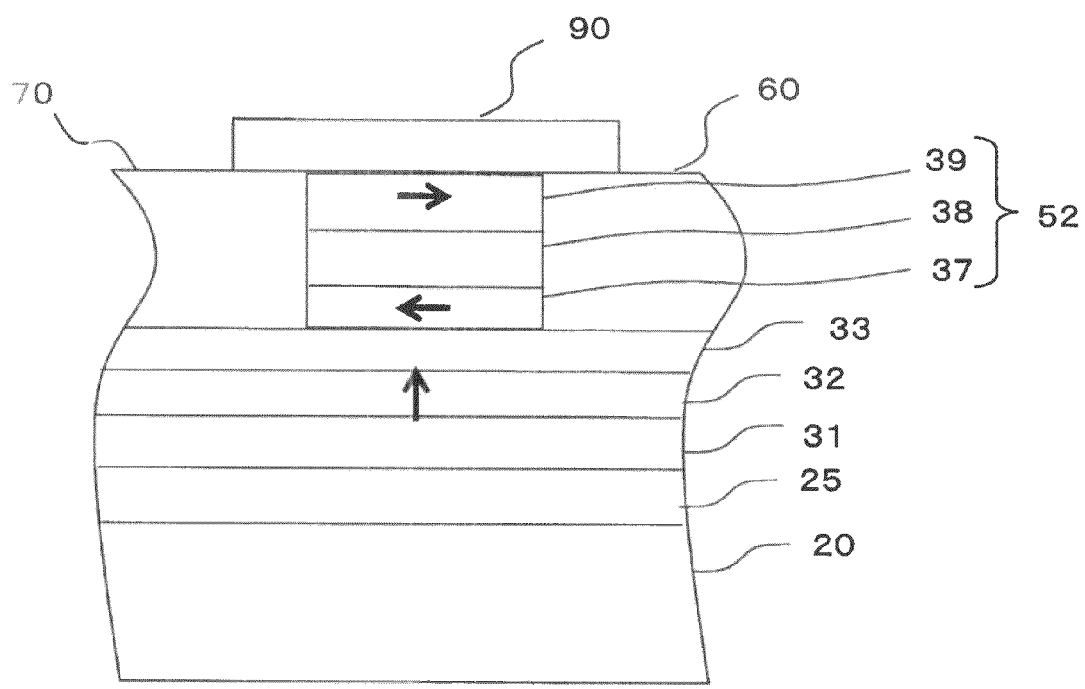
FIG. 9 is a view showing a fourth modified example of the detecting portion 50 of the spin wave element in accordance with the first embodiment.

FIG. 9 is a view showing a fourth modified example of the detecting portion 50 of the spin wave element 10 in accordance with the first embodiment.

A detecting portion 52 in accordance with the fourth modified example differs from the detecting portion 50 of the spin wave element 10 in accordance with the first embodiment in that the detecting portion 52 is provided with the ferromagnetic layer 35 and the antiferromagnetic layer 34.

First Example

A micromagnetics simulation was carried out to check spin wave propagation in the ferromagnetic layer 32 having magnetization perpendicular to the in-plane direction of the ferromagnetic layer 32.

The shape of the outer edge of the ferromagnetic layer 32 is an ellipsoid whose long axis connects the input portion 40 and the detecting portion 50. In addition, the input portion 40 (excitation position) and the detecting portion 50 (sensing position) exist in the ferromagnetic layer 32. The portion corresponding to the nonmagnetic insulating layer 60 assumes a vacuum.

Figure 10:
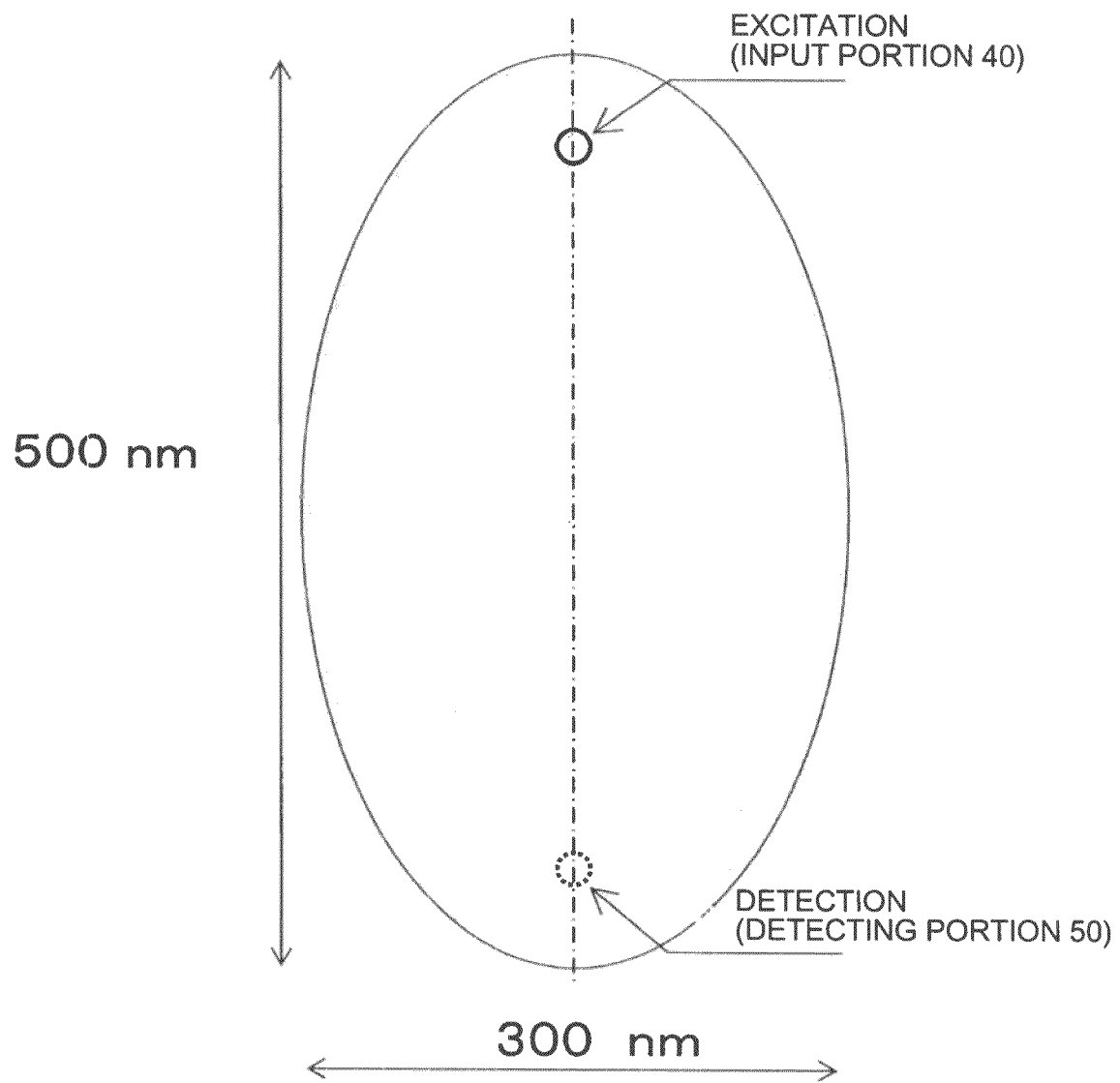
FIG. 10 is a view to explain a first example with an ellipsoid of a ferromagnetic layer.

As shown in FIG. 10, the ellipsoid of the ferromagnetic layer 32 has a long axis of 500 nm and a short axis of 300 nm. Moreover, it is assumed that the magnetization, the perpendicular magnetic anisotropy (Ku), and the film thickness of the ferromagnetic layer 32 are 700 emu/cc, 6.4×10$^6$ erg/cc, and 5 nm, respectively. Moreover, the diameter of the input portion 40 is 28 nm. The position of the input portion 40 is located on the long axis of the ellipsoid and on the one of the focal spots of the ellipsoid which the ferromagnetic layer 32 makes.

Figure 11:
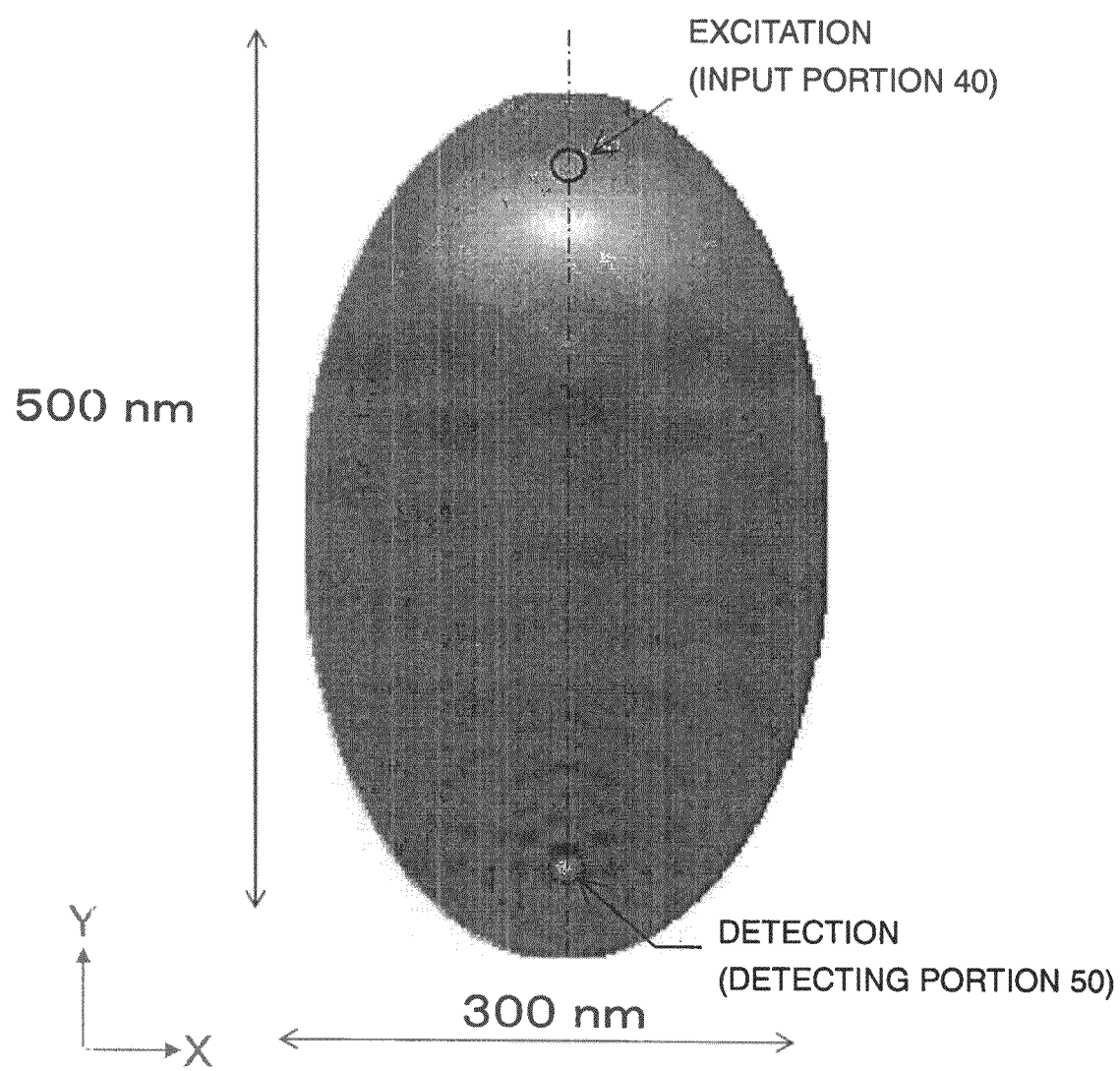
FIG. 11 is a view showing a distribution of magnetization directions by shading when 123 ps (picoseconds) pass from the excitation of a spin wave.

FIG. 11 is a view showing a distribution of the magnetization directions by shading when 123 ps (picoseconds) pass from the excitation of a spin wave. The fluctuation of the Y-axis components of the magnetization directions is expressed with shading.

It can be seen that the fluctuation of the magnetization directions makes a wave which propagates as a spin wave. As is seen in FIG. 11, the spin wave is collected around the detecting portion 50. The following should be noted. The outer edge shape of the ferromagnetic layer 32 is made to be an ellipsoid so that the long axis of the ellipsoid connects the input portion 40 and the detecting portion 50, thereby allowing it to sensitively detect the spin wave at the detecting portion 50.

Second Example

A micromagnetics simulation was carried out to check spin wave propagation in the ferromagnetic layer 32 having perpendicular magnetization.

Figure 12:
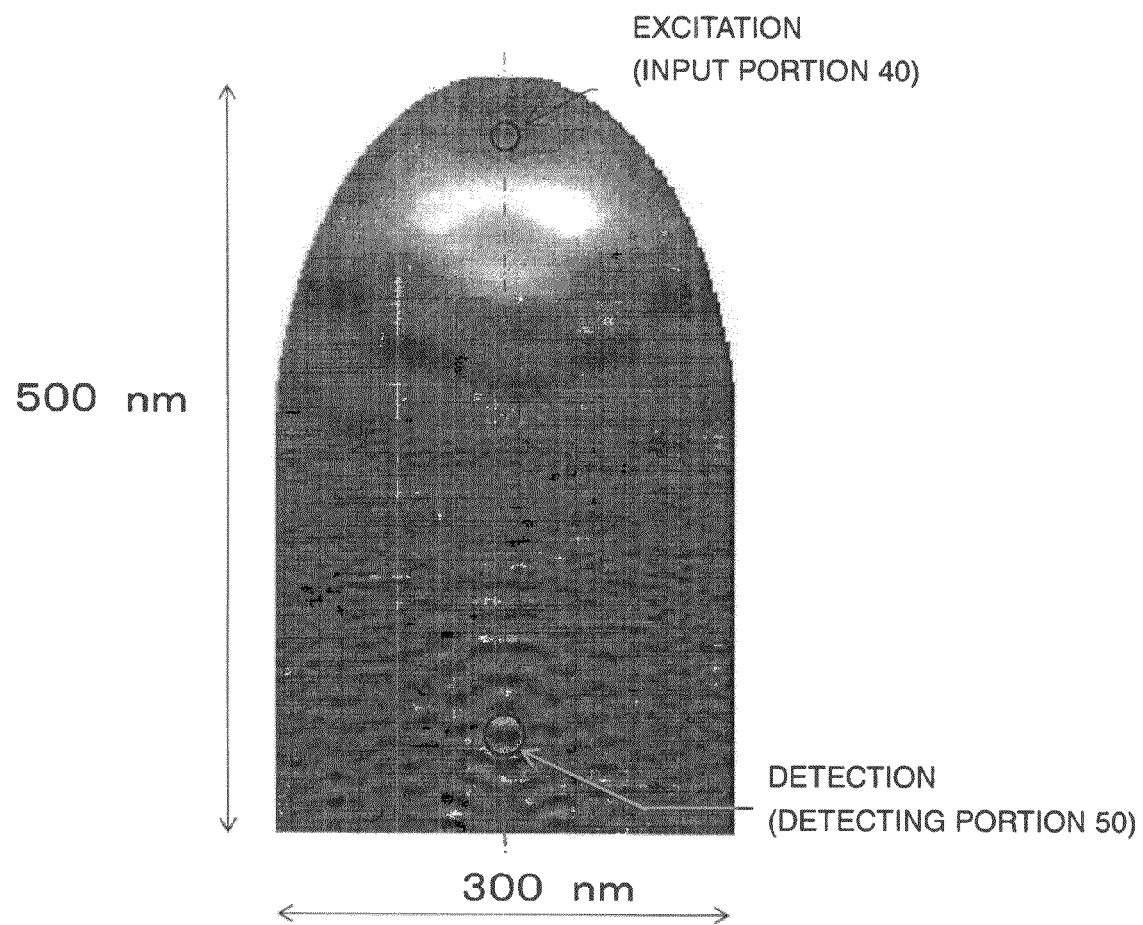
FIG. 12 is a view showing how a spin wave propagates from the input portion to the detecting portion.

FIG. 12 is a view showing how a spin wave propagates from the input portion 40 to the detecting portion 50. As shown in FIG. 12, the simulation is carried out as well as in the first example with the exception that the outer edge of the ferromagnetic layer 32 partially makes an ellipsoid on the side of the input portion 40. Therefore, explanations are omitted.

It can be seen in FIG. 12 that the outer edge of the ferromagnetic layer 32 is made to be partially ellipsoidal to also allow it to sensitively detect the spin wave at the detecting portion 50.

First Comparative Example

A micromagnetics simulation was carried out to check spin wave propagation in the ferromagnetic layer 32 having perpendicular magnetization.

The shape of the ferromagnetic layer 32 is made to be rectangular on the side of the input portion 40, and measures 600 nm wide by 600 nm long. The simulation is carried out as well as in the second example with the exception that the drawing shows a distribution simulated when 150 ps pass. Therefore, explanations are omitted.

Figure 13:
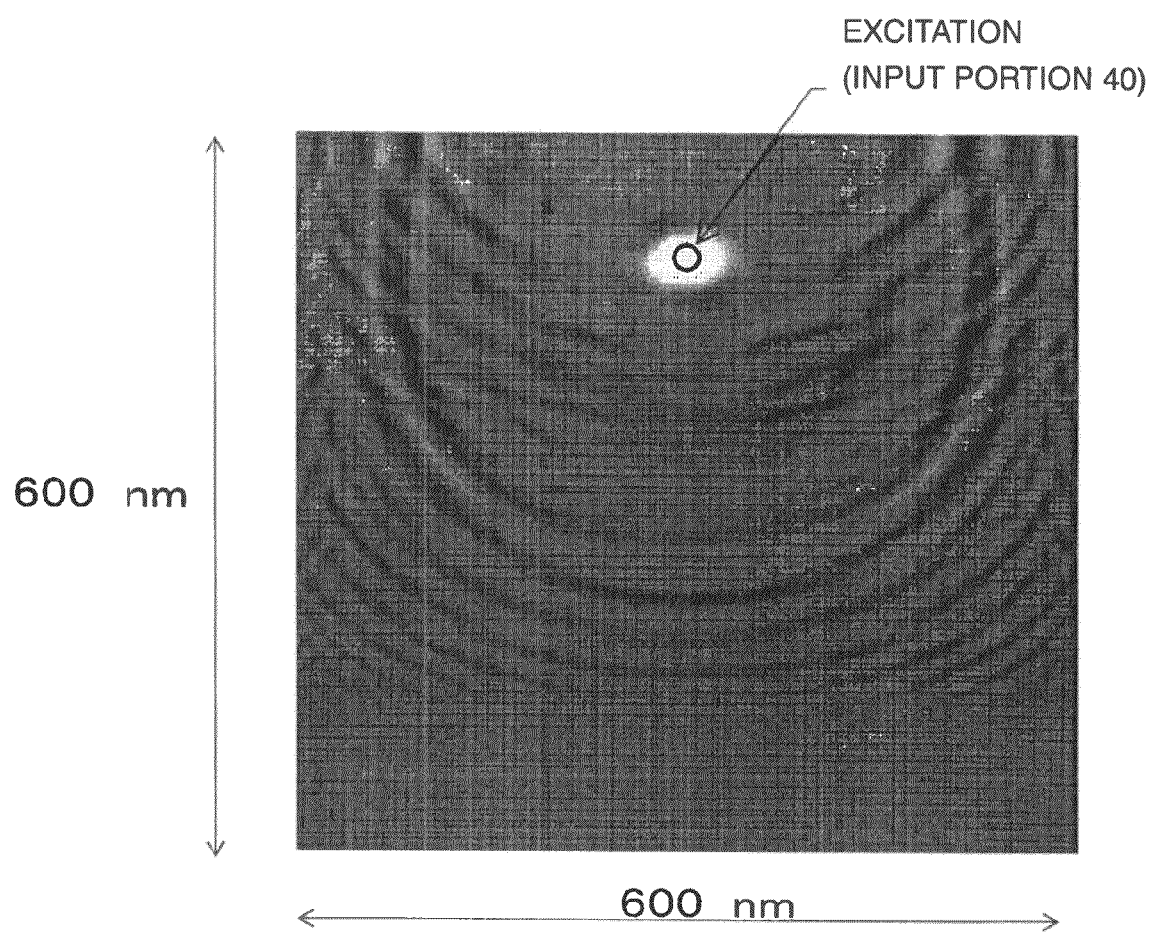
FIG. 13 is a view showing a distribution of magnetization directions by shading when 150 ps pass from the excitation of a spin wave.

FIG. 13 is a view showing a distribution of the magnetization directions by shading when 150 ps pass from the excitation of a spin wave. It can be seen that the spin wave excited at the input portion 40 spreads as a spherical wave and its amplitude attenuates with increasing the distance from the input portion 40. When this modified example is compared with the first and second examples, it should be noted that making the shape of the ferromagnetic layer 32 an ellipsoid and placing the input portion 40 and the detecting portion 50 on the long axis of the ellipsoid are essential to efficiently detect a spin wave at the detecting portion 50.

Fourth Embodiment

Figure 14:
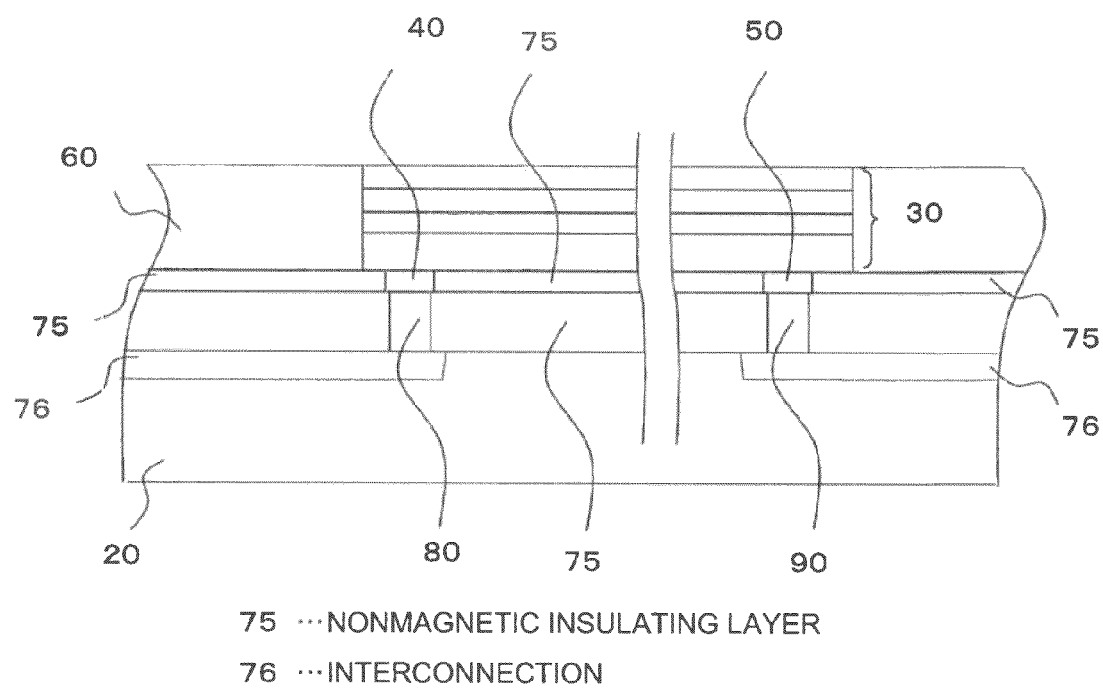
FIG. 14 is a view showing a structure for an input portion and an output portion in the spin wave elements in accordance with a fourth embodiment.
Figure 15:
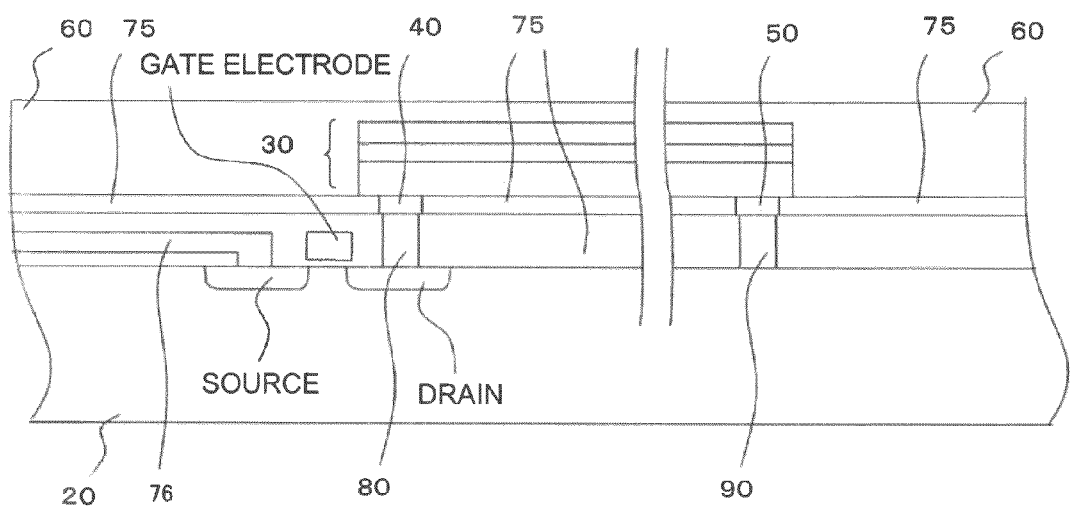
FIG. 15 is a view showing another structure for an input portion and an output portion in the spin wave elements in accordance with the fourth embodiment.
Figure 16:
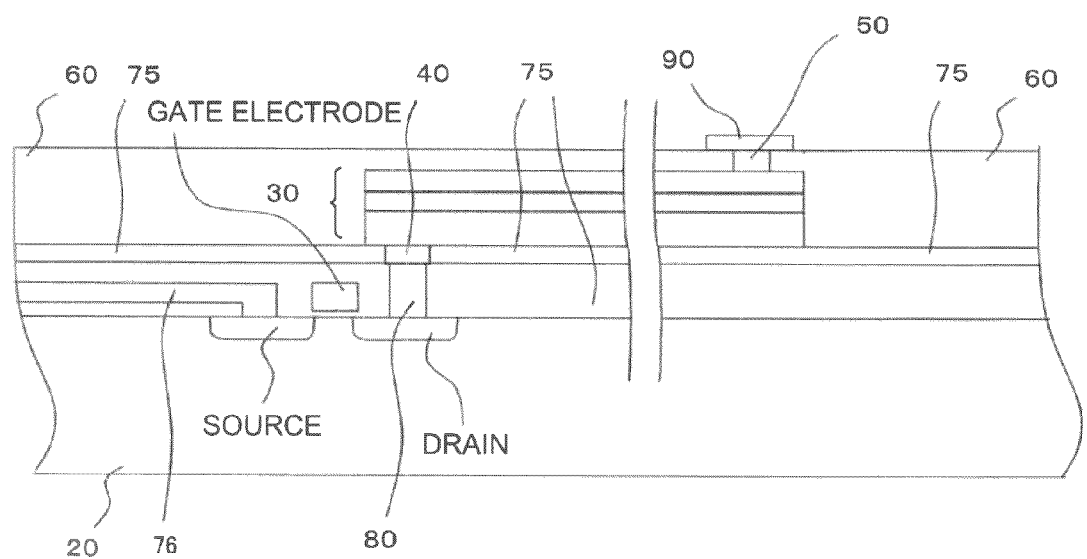
FIG. 16 is a view showing another structure for an input portion and an output portion in the spin wave elements in accordance with the fourth embodiment.

FIGS. 14 to 16 are views showing various structures for an input portion and an output portion of a spin wave element in accordance with a fourth embodiment.

The spin wave element shown in FIG. 14 differs from the spin wave element 10 in that the input portion 40, the detecting portion 50, and the electrodes 80, 90 are provided between the substrate 20 and the multilayer 30. The electrodes 80, 90 are connected electrically to an interconnection 76 provided in the substrate 20. In the above description, it has been assumed that the input portion 40 and the detecting portion 50 are provided on the opposite side of the multilayer 30 from the substrate 20. Even providing the input portion 40 and the detecting portion 50 on the same side of the multilayer 30 as the substrate 20 allows it to obtain the effect of the invention, as long as the outer edge of the multilayer 30 partially makes an ellipsoid viewed from the lamination direction thereof, and both the input portion 40 and the detecting portion 50 are on the long axis of the ellipsoid.

Also as shown in FIG. 15, CMOS is employed for the substrate 20, and the input portion 40 is connected to the drain of a MOSFET (Metal-Oxide-Semiconductor Field-Effect Transistor) through an electrode, thereby allowing it to perform switching in response to an input signal through the gate electrode of the MOSFET. In FIG. 15, the gate electrode extends in a direction perpendicular to the paper plane of FIG. 15.

Also as shown in FIG. 16, CMOS is employed for the substrate 20, and the input portion 40 is connected to the drain of a MOSFET through an electrode, thereby allowing it to perform switching in response to an input signal through the gate electrode of the MOSFET. In this case, the electrode 90 is exposed from the nonmagnetic insulating layer 60. In addition, in FIG. 16, the gate electrode extends in a direction perpendicular to the paper plane of FIG. 16. Even providing the input portion 40 and the detecting portion 50 on the opposite sides of the multilayer 30 from each other allows it to obtain the effect of the invention, as long as the outer edge of the multilayer 30 partially makes an ellipsoid viewed from the lamination direction thereof, and both the input portion 40 and the detecting portion 50 are on the long axis of the ellipsoid.

As described above, according to the first embodiment, a spin wave element includes a substrate, a multilayer, a detecting portion, and two or more input portions. The multilayer having a lamination direction thereof is formed on the substrate and includes a first ferromagnetic layer. The first ferromagnetic layer has magnetization whose direction is in the lamination direction. The detecting portion and the input portions are formed on the multilayer and separated from each other by a first nonmagnetic layer. In addition, a portion of an outer edge of the multilayer viewed from the lamination direction makes a portion of one ellipsoid. The detecting portion and one of the input portions are located on the long axis of the one ellipsoid. The portion of the one ellipsoid is located on a side of one of the input portions.

While certain embodiments of the invention have been described, these embodiments have been presented by way of example only, and are not intended to limit the scope of the inventions. Indeed, the novel elements and apparatuses described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A spin wave element comprising:
    a substrate;
    a multilayer, having a lamination direction, formed on the substrate and including a first ferromagnetic layer, the first ferromagnetic layer having a magnetization direction in the lamination direction; and
    a detecting portion and a plurality of input portions formed on the multilayer and separated from each other by a first nonmagnetic layer,
    wherein
        a portion of an outer edge of the multilayer includes a portion of an ellipsoid viewed from the lamination direction;
        the detecting portion and one of the input portions are located on the long axis of the ellipsoid; and
        one of the input portions is located on a side of the outer edge.

2. The element according to claim 1, further comprising an electrode layer provided between the multilayer and the substrate.

3. The element according to claim 2, wherein the outer edge is covered with a nonmagnetic insulating layer.

4. The element according to claim 1, wherein the input portions have a dot shape.

5. The element according to claim 1, wherein the input portions excite spin waves of the form of spherical waves in the first ferromagnetic layer.

6. The element according to claim 1, wherein an area of contact between the input portion and the multilayer is not less than 1 nm and not more than 500 nm.

7. The element according to claim 1, wherein
    the multilayer includes a first nonmagnetic layer and a second nonmagnetic layer; and
    the first ferromagnetic layer is formed between the first nonmagnetic layer and the second nonmagnetic layer.

8. The element according to claim 1, wherein
    the multilayer includes a second ferromagnetic layer and a spacer layer;
    the second ferromagnetic layer has magnetization whose direction is perpendicular to the lamination direction; and
    the spacer layer is provided between the first ferromagnetic layer and the second ferromagnetic layer.

9. The element according to claim 1, wherein
    the input portions or the detecting portion include a third ferromagnetic layer;
    the third ferromagnetic layer has magnetization whose direction is parallel or perpendicular to the lamination direction; and
    the multilayer includes a spacer layer between the first ferromagnetic layer and the input portion, or between the first ferromagnetic layer and the detecting portion.

10. The element according to claim 1, wherein
    the input portions or the detecting portion include a fourth ferromagnetic layer, a fifth ferromagnetic layer and an intermediate layer;
    the fourth ferromagnetic layer has magnetization whose direction is perpendicular to the lamination direction;
    the fifth ferromagnetic layer has magnetization whose direction is perpendicular to the lamination direction;
    the intermediate layer is provided between the fourth ferromagnetic layer and the fifth ferromagnetic layer; and
    the multilayer includes a spacer layer between the first ferromagnetic layer and the input portion, or between the first ferromagnetic layer and the detecting portion.

* * * * *